United States Patent [19]

Regan et al.

[11] Patent Number: 5,597,421
[45] Date of Patent: Jan. 28, 1997

[54] REFLECTOR/COLLECTOR FOR USE IN DIRECT ENERGY CONVERSION SYSTEMS

[76] Inventors: Thomas Regan, 7 Beaverbrook Rd., Westford, Mass. 01886; Jose Martin, 85 Mansur Rd., Lowell, Mass. 01852

[21] Appl. No.: 557,618

[22] Filed: Nov. 14, 1995

[51] Int. Cl.$^6$ ............................................. H01L 31/058
[52] U.S. Cl. ............................................. 136/253
[58] Field of Search ............................................. 136/253

[56] References Cited

U.S. PATENT DOCUMENTS

| | | | |
|---|---|---|---|
| 4,313,024 | 1/1982 | Horne | 136/253 |
| 4,313,425 | 2/1982 | Crackel et al. | 126/678 |
| 4,316,048 | 2/1982 | Woodall | 136/253 |
| 4,331,829 | 5/1982 | Palazzetti et al. | 136/253 |
| 4,419,532 | 12/1983 | Severns | 136/253 |
| 4,584,426 | 4/1986 | Nelson | 136/253 |
| 4,746,370 | 5/1988 | Woolf | 136/246 |
| 4,776,895 | 10/1988 | Goldstein | 136/253 |
| 4,784,700 | 11/1988 | Stern et al. | 136/248 |
| 5,080,724 | 1/1992 | Chubb | 136/253 |
| 5,312,521 | 5/1994 | Fraas et al. | 136/253 |
| 5,360,490 | 1/1994 | Nelson | 136/253 |
| 5,383,976 | 1/1995 | Fraas et al. | 136/253 |
| 5,401,329 | 3/1995 | Fraas et al. | 136/253 |
| 5,503,368 | 4/1996 | Goldstein | 136/253 |

OTHER PUBLICATIONS

Fraas, A. P., *Design and Development Tests of Direct–Condensing Potassium Radiators*, USAEC Report Conf–651026 (USA 1965).

*Primary Examiner*—Aaron Weisstuchi

[57] ABSTRACT

The invention increases the efficiency of energy conversion processes by providing a system including a thermal radiation source, a reflective surface, and an energy collector such that a photon flux emitted by the thermal radiation source is substantially isotropically reflected by the reflective surface. The thermal radiation source can include additional elements for selecting the angle and wavelengths of the emitted radiation, and the reflective surface may comprise a diffuse reflective surface formed of ceramics, composites, plastics, or metals.

16 Claims, 3 Drawing Sheets

REFLECTOR/COLLECTOR FOR USE IN DIRECT ENERGY CONVERSION SYSTEMS

BACKGROUND OF THE INVENTION

In thermophotovoltaic (hereinafter, "TPV") energy conversion, radiation from heated surfaces is intercepted by photovoltaic (hereinafter, "PV") cells. If the PV cells are chosen so that their energy gap for charge separation is matched to the energy of the intercepted radiation, electricity will be generated.

There have been several efforts to concentrate thermal radiation through the use of mirrors (specular reflectors) analogous to those used to concentrate sunlight to decrease the cell area necessary for PV conversion. U.S. Pat. No. 5,312,521 to Fraas and a reference document to U.S. Pat. No. 5,312,521 "The Design and Development Tests of Direct-Condensing Potassium Radiators" draw from this work. Also devices have been proposed to incorporate a reflector for reflecting a second portion of the incoming energy to the thermal radiator (U.S. Pat. No. 4,746,370 to Woolf). These devices utilize specular mirrors to reflect and redirect incident photons.

There are important differences between sunlight and the radiation from practical thermal sources, however. Direct sunlight is almost a parallel beam, that is, it is characterized by a small angle. Since the angle between light reflected from a specular mirror and the perpendicular to the mirror is the same as the angle between the incident light and the perpendicular to the mirror, direct sunlight reflected from a specular mirror will also subtend a small angle, and thus it may be possible to design a mirror so that it will redirect sunlight onto a small concentration area. The theoretical limit to how much radiation within a certain angle $_\Theta$ may be concentrated in two dimensions is $1/(sin_\Theta)2$.

Thermal radiation on the other hand tends to have a large angular spread, $\oplus$, in fact it is isotropic for black bodies. Thus, when radiation characterized by a wide angle spread is reflected by a specular surface, the reflected radiation will also be spread over a wide angle. In the limit of isotropic radiation incident, the theoretical limit of concentration is one. That is, concentration is not possible.

Another major difference between sunlight and thermal radiation has to do with power densities. Because of the large distance from the sun to the earth, the maximum intensity for sunlight on the surface of the earth is close to 1.3 kW/m 2, which is not only several orders of magnitude smaller that the irradiance from a black body hot enough to emit radiation at a spectrum approximating sunlight, but several orders of magnitude smaller than the irradiance from a gray body which is hot enough to emit appreciable radiation at the lowest photon energies which will generate charge separation in PV cells. Because no mirror is perfect, the absorber fraction will tend to heat the reflecting surface to temperatures which are too high for traditional reflectors, i.e. mirrors, lenses, and holograms. This is a consequence of Kirchoffs Law, which states that if a surface is a poor absorber at a certain wavelength, it will be a poor emitter at the same wavelength and angle.

From these considerations it appears that conventional mirrors are not attractive redirectors of thermal radiation for TPV devices—and neither are lenses or holograms. Gold may be the one exception to this statement, but gold is cost prohibitive for many TPV applications. These arguments can be augmented with the observation that in many TPV conversion devices the emitting reflecting and converting surfaces may be exposed to reducing and reactive atmospheres.

SUMMARY OF INVENTION

Specular reflector-based energy conversion systems are common in solar energy engineering. The use of diffuse reflectors in many energy conversion systems is overlooked due to the almost-beam nature of direct sunlight. TPV energy conversion systems, however, are capable of efficiently utilizing diffuse reflectors. Sunlight (on the Earth's surface) is a parallel light source, and a system can then effectively use a specular reflector to direct the incident light onto a specific target area. A diffuse source, however, emits in all directions, and a diffuse reflector can then be utilized in directing the photons to the target area (PV cells). In many configurations of interest, a diffuse surface can exchange more radiation with another diffuse surface than a surface of the same size that is a specular surface. The diffuse surface effectively "sees" more of the surface that it is exchanging photons with.

The use of diffuse reflectors may well have been overlooked due to the familiarity of many engineers and scientists with solar energy conversion. In a TPV converter, however, the distance between the thermal source and the energy converter is much smaller than the distance between the Sun and the Earth, and this makes the emitted photon distribution have a wider angular spread than that of direct sunlight at the surface of the Earth. This wide angular spread allows for a deviation from conventional thinking. To redirect photons emitted from a source at a relatively small distance, a white body or a diffuse reflector can be superior to a specular surface. A white or diffuse reflecting surface is a surface which is not specular, but which reflects light over a large angle, regardless of the angle of incidence. The problem of how much energy will eventually be intercepted by a converter can be treated in terms of a straightforward modification of the classical "gray body" treatment of radiation heat transfer, in terms of view factors. Thus, all of the energy emitted from a source, a certain fraction, the view or geometry factor, will be intercepted by the white surface. Assuming that all of the incident radiation on that surface is reflected, one can estimate how much of the radiation will reach a third surface. For example, the radiation reaching the surface subtended by the converter may be estimated by simply multiplying the total radiation intercepted by the white surface times the view factor from the white surface to the converter surface. For many configurations of interest the fraction of energy incident on the converter is higher when diffuse reflectors are used in place of specular mirrors.

In one aspect the invention provides for a thermal radiation source, a reflective surface optically coupled with the thermal radiation source, and an energy collector optically coupled with the reflective surface. The reflective surface is coupled with the thermal radiation source such that a photon flux emitted by the radiation source is substantially isotropically reflected. In addition, the energy collector receives the isotropically reflected photon flux and converts the photon flux to electrical energy. Preferably, the reflective surface is positioned relative to the radiation source such that the emitted photon flux is reflected over a large range of angles, regardless of the angle of incidence of the emitted photon flux.

In order to operate at the high temperatures necessary for TPV conversion, material considerations are important. Diffuse reflectors can be constructed from ceramic or oxide materials, which generally can withstand high temperatures and harsh environments with little or no material degradation. This innovation will allow for a TPV system to be constructed using currently available technology, bypassing the needs of a high temperature specular reflector.

For TPV conversion, it is of interest to maximize the area of the emitter and minimize the active area of the conversion device. Diffuse reflectors can be used to achieve these goals and to reduce inherent system losses. Another advantage of diffuse reflectors follows from the desirability of generating a relatively uniform photon flux over the entire converter surface. A flat flux profile is desirable because of considerations related to both materials limitations and energy conversion efficiencies.

DETAILED DESCRIPTIONS OF PREFERRED EMBODIMENTS

Figure 1:
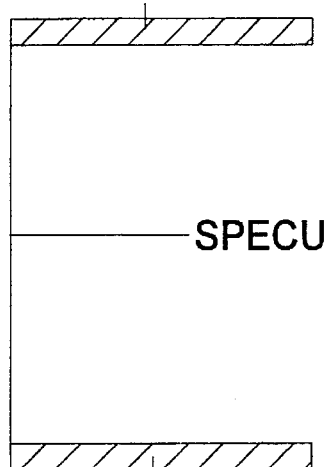
FIG. 1 shows a schematic of a specular system.

FIG. 1 details prior art, a specular reflection system. The photon source (1) represents the emitting surface. This surface is thermally excited, such that as a result of the thermal excitation it emits a photon flux. The excited surface is the source of the photon flux for the energy conversion system. A conversion device located in the cell area (2) is represented but not limited to a surface parallel to the photon source. To enhance the transmission of the; photon flux from the photon source (1) to the cell area (2), a specular or imaging reflector (3) is represented but not limited to one surface perpendicular to that of the converter surface. It is clear that many photons emitted by the source (1) and reflected by the reflector (3) will not reach the cell area (2).

Figure 2:
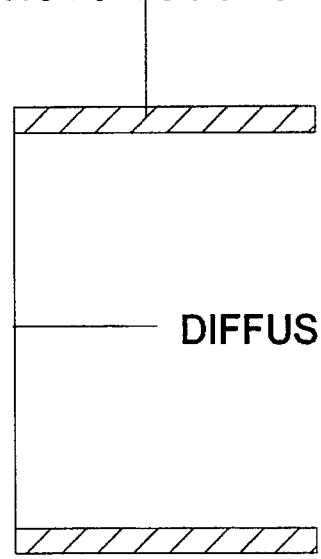
FIG. 2 shows a schematic of a diffuse energy conversion system in accordance with the invention.

FIG. 2 details new teaching, where a diffuse reflector replaces the specular reflector in the same geometry as FIG. 1. The photon source (4) represents the diffuse thermal emitter. This surface is thermally excited, such that as a result of the thermal excitation the surface emits a photon flux. The excited surface is the source of the photon flux for the energy conversion system. A conversion device located in the cell area A2(5) is represented but not limited to be parallel to the photon source. A diffuse reflector surface A1(6) is then used to reflect the emitted photon flux from the photon source, and some of the reflected photons will reach the cells in area A2. The diffuse reflector surface A1 (6) is represented as, but not limited to, being perpendicular to the converter surface. Using the shape or view factors between the different surfaces, it can be shown that the diffuse photon reflection from many photon source geometries is a more effective mechanism for redirecting the photon flux to the converter than a specular surface.

Diffuse photon reflection is superior to specular photon reflection because for specular reflectors the angle of reflection is equal to the angle of incidence, and in some configurations the direction of the specularly reflected light may not be advantageous for collection. With a diffuse reflector, on the other hand, the light will be reflected in all directions, and the weighted effect of all the reflected light incident on a collector is more favorable.

Figure 3:
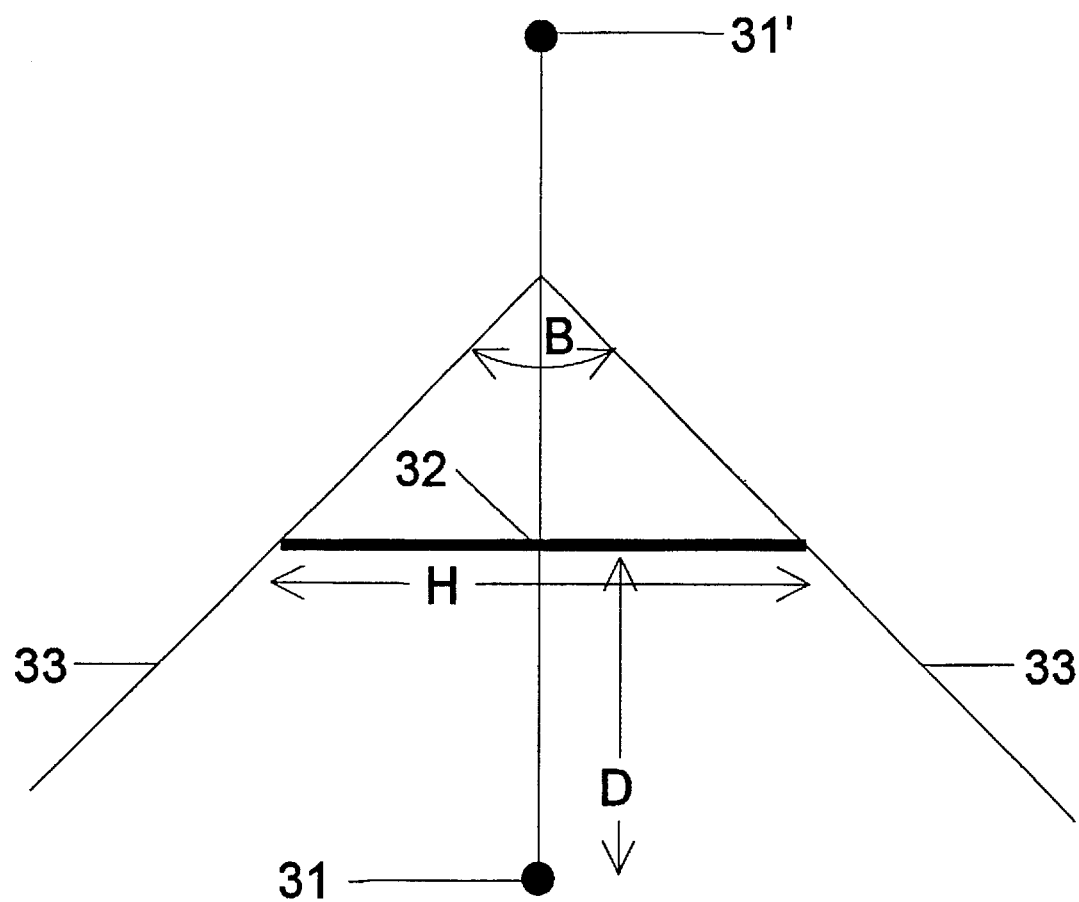
FIG. 3 illustrates differences between specular and diffuse systems.

FIG. 3 illustrates this effect. In particular, consider the simple case of an isotropic point source of incandescent light, 31, placed equidistantly between two finite collecting surfaces, 33, which make an angle B with respect to each other.

Consider the increase of the light flux incident on the surfaces 33 if a reflector 32 is placed between them, and at a distance D from the incandescent source 31. If the reflector is specular, no additional flux will reach surface 33 if B/2 is greater than $$\tan^{-1}\frac{H}{2D},$$

because the reflected light will appear as emanating from the mirror image 31' of the light source, and surfaces 33 do not see that mirror.

On the other hand, if the reflecting surface is diffuse, there will always be some additional flux incident on surfaces 33, because the light is reflected in all directions, and some of it will illuminate surfaces 33.

The diffuse reflectors can be produced from many ceramic materials. The use of ceramic or ceramic composite material would permit operation at high temperature. A highly reflective substantially diffuse ceramic overcomes many internal environment constraints that limit the materials selection. For example, for high temperature operation, it is possible to use a rare earth oxide material for constructing the reflector. In alternative embodiments, metal, plastic, or composite can be used to produce the substantially diffuse reflection.

Figure 4:
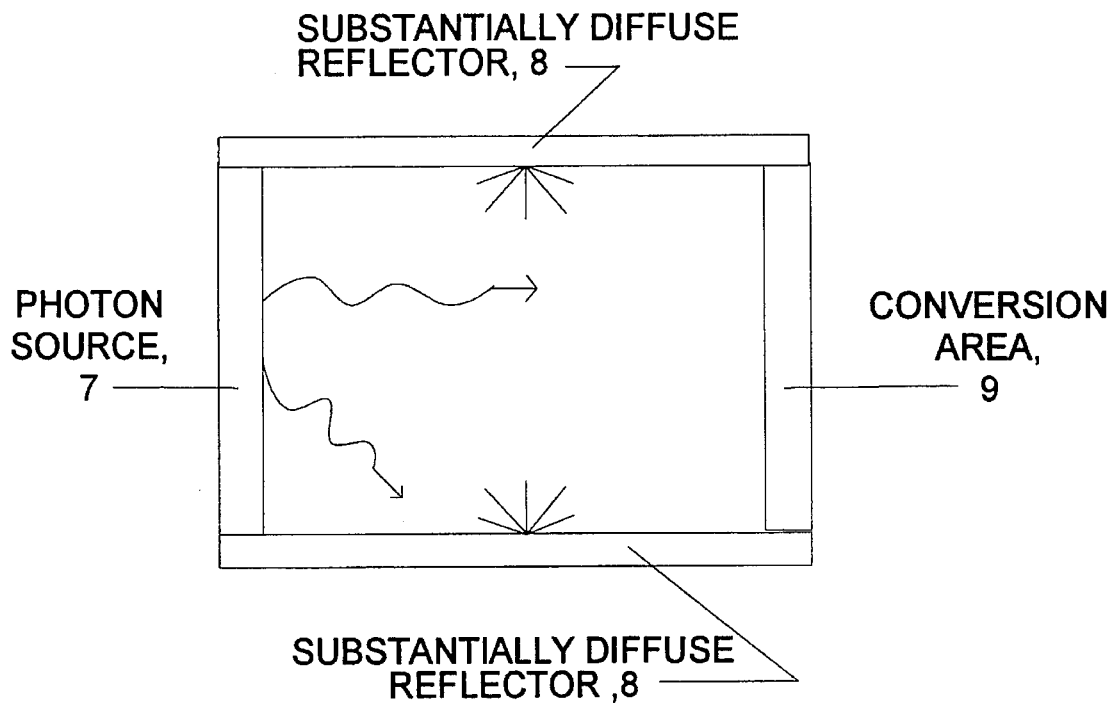
FIG. 4 shows an additional schematic representation of a diffuse energy conversion system.

FIG. 4 shows the TPV energy conversion system that utilizes substantially diffuse reflectors to decrease the conversion device area. The example shown is a flat plane photon emitter (7), with diffuse reflectors (8) utilized to reduce end losses and the required conversion area (9) of the system.

Figure 5:
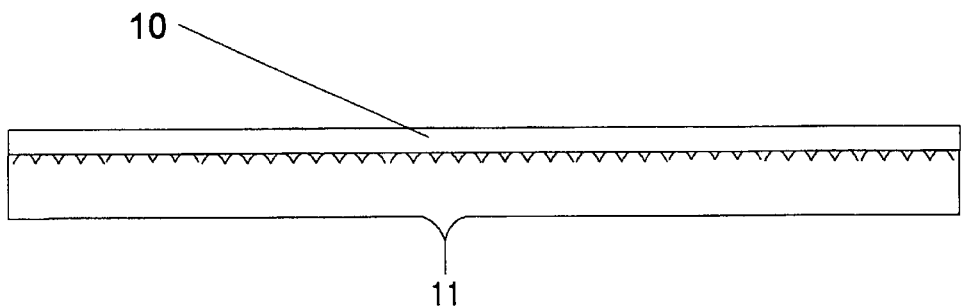
FIG. 5 is a detailed cross-sectional view of a photon source.

FIG. 5 shows a modification of the photon source that produces an angularly and spectrally selective emitter. In this design, surface indentations ( 11 ) of a scale of a few microns or larger change the emission characteristics of the photon emitter in at least two ways. The indentations increase the overall emittance from the surface. The indentations also change the angular distribution of the emitted radiation, allowing tailoring of the directional emittance. The relative size of the indentations is dependent on the wavelength of interest. The indentation surface length should be on the order of several times the photon wavelength of interest. Past efforts in the area of emission surface modification have been performed by Fraas et al. U.S. Pat. No. 5,312,521. The novel approach in the invention disclosed herein is the use of micron size features. On the micron level it is possible to design the surface features so as to optimize the angular selectivity of the photon source. By providing a tool to tailor the angular selectivity, it will be possible to decrease the inherent geometrical losses in the overall system and to utilize geometries which are currently not viable because of geometrical losses.

There are several mechanisms to achieve spectral selectivity. One innovation to achieve selectivity is to fabricate the indentations on a low-emission, high thermal conductivity base material (10), such as, but not limited to, beryllium oxide. A spectrally selective coating is then applied to the indented surface (11). Such a selective coating may be created by, but not limited to, one innovation which consists of thermal coating of the base surface with desired metal(s) followed by conversion of the metal(s) to oxide form. Such a surface would have both angular and spectral selectivity.

A possible configuration for the emission surface may be, but is not limited to, one where it is located parallel to the energy conversion device. The sides of the unit have diffuse reflectors that diffusely redirect a portion of the radiation from the emitter to the converter.

A high enthalpy fluid can then be used to thermally excite the photon emitter. This fluid can be supplied from a variety of thermal sources including: combustion, solar thermal, nuclear, or chemical. In a closed loop mode of operation where the only mechanism for energy to leave the system is through radiant transfer to the converter, high efficiencies of conversion can be achieved. Any waste heat produced from the system can be recycled in either a cogeneration application, or a regenerator to increase the overall system efficiency.

While the invention has been shown and described having reference to specific preferred embodiments, those skilled in the art will understand that variations in form and detail may be made without departing from the spirit and scope of the invention. Having described the invention, what is claimed as new and secured by letters patent is:

We claim:

1. An energy conversion system comprising:
   a thermal radiation source for emitting a photon flux;
   a reflective surface optically coupled to the radiation source, the reflective surface reflecting the photon flux such that the reflected photon flux is substantially isotropically reflected, independent of the radiation source; and
   an energy collector for receiving and converting the substantially isotropically reflected photon flux to electrical energy.

2. An energy conversion system according to claim 1, wherein the thermal radiation source further comprises selecting means for emitting a photon flux at a selected angle relative to the surface of the radiation source and at a selected wavelength.

3. The energy conversion system of claim 2 wherein the selecting means is made of a ceramic material.

4. The energy conversion system of claim 2 wherein the selecting means is made of a metal material.

5. The energy conversion system of claim 2 wherein the selecting means is made of a ceramic-metal composite material.

6. The energy conversion system of claim 2 wherein the selecting means is constructed of a combination of isotropic and specular surfaces.

7. The energy conversion system of claim 2 wherein the selecting means is constructed of a thermally evaporated metal converted to oxide on a base material.

8. The energy conversion system of claim 1 wherein the reflective surface further comprises a substantially diffuse reflective surface.

9. The energy conversion system of claim 8 wherein the substantially diffuse reflective surface is made of a ceramic material.

10. The energy conversion system of claim 8 wherein the substantially diffuse reflective surface is made of a plastic material.

11. The energy conversion system of claim 8 wherein the substantially diffuse reflective surface is made of a composite material.

12. A thermophotovoltaic energy conversion system comprising:
    thermal energy source;
    a radiation source thermally coupled to the thermal energy source to emit radiation upon being thermally excited by the thermal energy source;
    a substantially diffuse reflective surface for diffusely reflecting the emitted radiation; and
    a device for converting thermal radiation to electrical energy.

13. The energy conversion system of claim 12 wherein the thermal energy source comprises a combustion source.

14. The energy conversion system of claim 12 wherein the thermal energy source comprises a nuclear source.

15. The energy conversion system of claim 12 wherein the thermal energy source comprises a solar thermal source.

16. The energy conversion system of claim 12 wherein the thermal energy source comprises a chemical source.

* * * * *